(12) United States Patent
Kobayashi et al.

(10) Patent No.: US 9,960,584 B2
(45) Date of Patent: May 1, 2018

(54) ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

(72) Inventors: Takehito Kobayashi, Mie (JP); Yoshikazu Sasaki, Mie (JP); Shigeki Yamane, Mie (JP); Yukinori Kita, Mie (JP); Tomohiro Ooi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days. days.

(21) Appl. No.: 15/507,677

(22) PCT Filed: Sep. 16, 2015

(86) PCT No.: PCT/JP2015/076220
§ 371 (c)(1),
(2) Date: Feb. 28, 2017

(87) PCT Pub. No.: WO2016/043204
PCT Pub. Date: Mar. 24, 2016

(65) Prior Publication Data
US 2017/0256929 A1      Sep. 7, 2017

(30) Foreign Application Priority Data
Sep. 18, 2014   (JP) ................................. 2014-189895

(51) Int. Cl.
*H02G 3/14*    (2006.01)
*H05K 7/20*    (2006.01)
(Continued)

(52) U.S. Cl.
CPC ............... *H02G 3/14* (2013.01); *B60R 16/02* (2013.01); *H02G 3/081* (2013.01); *H02G 3/088* (2013.01);
(Continued)

(58) Field of Classification Search
CPC ........ H02G 3/088; H02G 3/081; H02G 3/086; H02G 3/14; H02G 3/08; B60R 16/0239;
(Continued)

(56) References Cited

U.S. PATENT DOCUMENTS

2012/0002381 A1* 1/2012 Zanoni .................. H05K 1/144
                                                    361/752
2012/0091154 A1* 4/2012 Satoh .................. B60R 16/0238
                                                    220/660
2017/0112004 A1* 4/2017 Takamatsu ........... H05K 5/0052

FOREIGN PATENT DOCUMENTS

JP    2001223489 A      8/2001
JP    2001314017 A   * 11/2001
(Continued)

*Primary Examiner* — Hoa C Nguyen
*Assistant Examiner* — Amol Patel
(74) *Attorney, Agent, or Firm* — Dinsmore & Shohl LLP

(57) ABSTRACT

An electrical junction box includes a circuit structure, a case main body made of a synthetic resin and having an accommodating portion that accommodates the circuit structure, and a cover 30 made of a metal and that is attached to the case main body, covering the accommodating portion thereof. The cover has a covering wall that covers the accommodating portion of the case main body and a side wall that is continuous with the covering wall and that is disposed around the case main body. The case main body is provided with an abutment portion that abuts on a portion of the side wall of the cover, but not on an end portion of the side wall that is located on the side facing away from the covering wall.

7 Claims, 6 Drawing Sheets

(51) Int. Cl.
  *B60R 16/02* (2006.01)
  *H02G 3/08* (2006.01)
  *H05K 5/00* (2006.01)
  *H02G 3/16* (2006.01)

(52) U.S. Cl.
  CPC ......... *H05K 5/0047* (2013.01); *H05K 7/2039* (2013.01); *H05K 7/20854* (2013.01); *H02G 3/16* (2013.01)

(58) Field of Classification Search
  CPC .... B60R 16/02; H05K 5/0026; H05K 5/0047; H05K 5/0052; H05K 5/0056; H05K 1/0203; H05K 7/2039; H05K 7/20854
  See application file for complete search history.

(56) References Cited

FOREIGN PATENT DOCUMENTS

| | | |
|---|---|---|
| JP | 2011004531 A | 1/2011 |
| JP | 2014103747 A | 6/2014 |

* cited by examiner

ELECTRICAL JUNCTION BOX

CROSS-REFERENCE TO RELATED APPLICATIONS

This application is the U.S. national stage of PCT/JP2015/076220 filed on Sep. 16, 2015, which claims priority of Japanese Patent Application No. JP 2014-189895 filed on Sep. 18, 2014.

FIELD OF THE INVENTION

The present invention relates to an electrical junction box.

BACKGROUND

An electronic controller in which a circuit board unit in which an electronic circuit portion is assembled is accommodated in a casing that is made of a metal has conventionally been known (see JP 2001-223489A, for example). The metal casing is constituted by a flat box-shaped frame and a lid member that covers an opening of the frame, and is configured to be hermetically sealed by fastening the frame and the lid member to each other through screwing.

The aforementioned metal casing has a relatively small thickness. For this reason, in a state in which it is installed in a vehicle such as an automobile, the metal casing easily vibrates, and there is a risk that the frame and the lid member may hit each other at a portion other than a screwed portion and generate noise.

The present invention was made based on the above-described circumstances, and it is an object thereof to provide an electrical junction box in which the generation of noise is suppressed.

SUMMARY OF INVENTION

The present invention is an electrical junction box including a circuit structure, a case main body that is made of a synthetic resin and that has an accommodating portion that accommodates the circuit structure, and a cover that is made of a metal and that is attached to the case main body, covering the accommodating portion of the case main body, wherein the cover has a covering wall that covers the accommodating portion of the case main body and a side wall that is continuous with the covering wall and that is disposed around the case main body, and the case main body is provided with an abutment portion that abuts on a portion of the side wall of the cover, but not on an end portion of the side wall that is located on the side facing away from the covering wall.

In the present invention, the case main body, which is made of a synthetic resin, is provided with the abutment portion that abuts on a portion of the side wall of the cover, which is made of a metal, but not on the end portion of the side wall that is located on the side facing away from the covering wall. Therefore, according to the present invention, even when the electrical junction box is exposed to vibration as in the case where it is installed in a vehicle such as an automobile, vibration is suppressed due to the cover abutting on the abutment portion of the case main body, and thus the generation of noise is also suppressed.

The present invention may also have the following configurations.

It is also possible that a guide surface that guides the cover in an attachment direction is formed in a surface of the case main body that is continuous with the abutment portion.

With this configuration, after the cover and the case main body abut on each other, the cover is guided in the attachment direction by the guide surface, and thus the cover can be smoothly attached to the case main body.

It is also possible that a surface that is continuous with the abutment portion and that extends in a direction away from the side wall of the cover is formed frontward of the abutment portion with respect to an attachment direction of the cover.

With this configuration, the cover and the case main body do not come into contact with each other frontward of the abutment portion with respect to the attachment direction of the cover, and thus the effect of suppressing the generation of noise is ensured.

It is also possible that the abutment portion has a curved shape in cross section taken in a direction that is parallel to an attachment direction of the cover.

With this configuration, the side wall of the cover can be prevented from being damaged by the abutment portion.

It is also possible that only one abutment portion is provided for each one of said side walls in cross section taken in a direction that is parallel to an attachment direction of the cover.

With this configuration, the cover and the case main body do not abut on each other at a plurality of locations, and thus the effect of suppressing the generation of noise is ensured.

It is also possible that an angle that is defined by the covering wall and the side wall is an obtuse angle. With this configuration, the ease of molding is achieved.

It is also possible that the case main body is provided with a recess through which water that has entered between the case main body and the cover is drained, the recess being provided frontward of the abutment portion with respect to an attachment direction of the cover.

With this configuration, the circuit structure can be protected against the entry of water. Moreover, with the above-described configuration, the position and the area of the abutment portion can also be adjusted by adjusting the position of the recess.

It is also possible that the electrical junction box further includes a heat dissipation member that is made of a metal and that accommodates the case main body in conjunction with the cover. With this configuration, the heat dissipation member that dissipates heat generated by the circuit structure functions as an accommodating container, and thus the heat dissipation properties can be increased while reducing the number of components.

According to the present invention, it is possible to provide an electrical junction box in which the generation of noise is suppressed.

DETAILED DESCRIPTION OF THE PREFERRED EMBODIMENTS

Embodiment 1

Embodiment 1 of the present invention will be described with reference to FIGS. 1 to 6.

An electrical junction box 10 of Embodiment 1 is disposed on a power supply path between a power source such as a battery and a load that is constituted by in-vehicle electrical equipment such as a lamp, a driving motor, or the like in a vehicle such as an electric automobile or a hybrid automobile, for example, and is used for a DC-DC converter, an inverter, or the like, for example. In the following description, with respect to an upper-lower direction, the upper side in FIG. 2 will be referred to as "upper side", and the lower side as "lower side", and with respect to a front-rear direction, the front side in FIG. 3 will be referred to as "front side", and the back side as "rear side".

Figure 1:
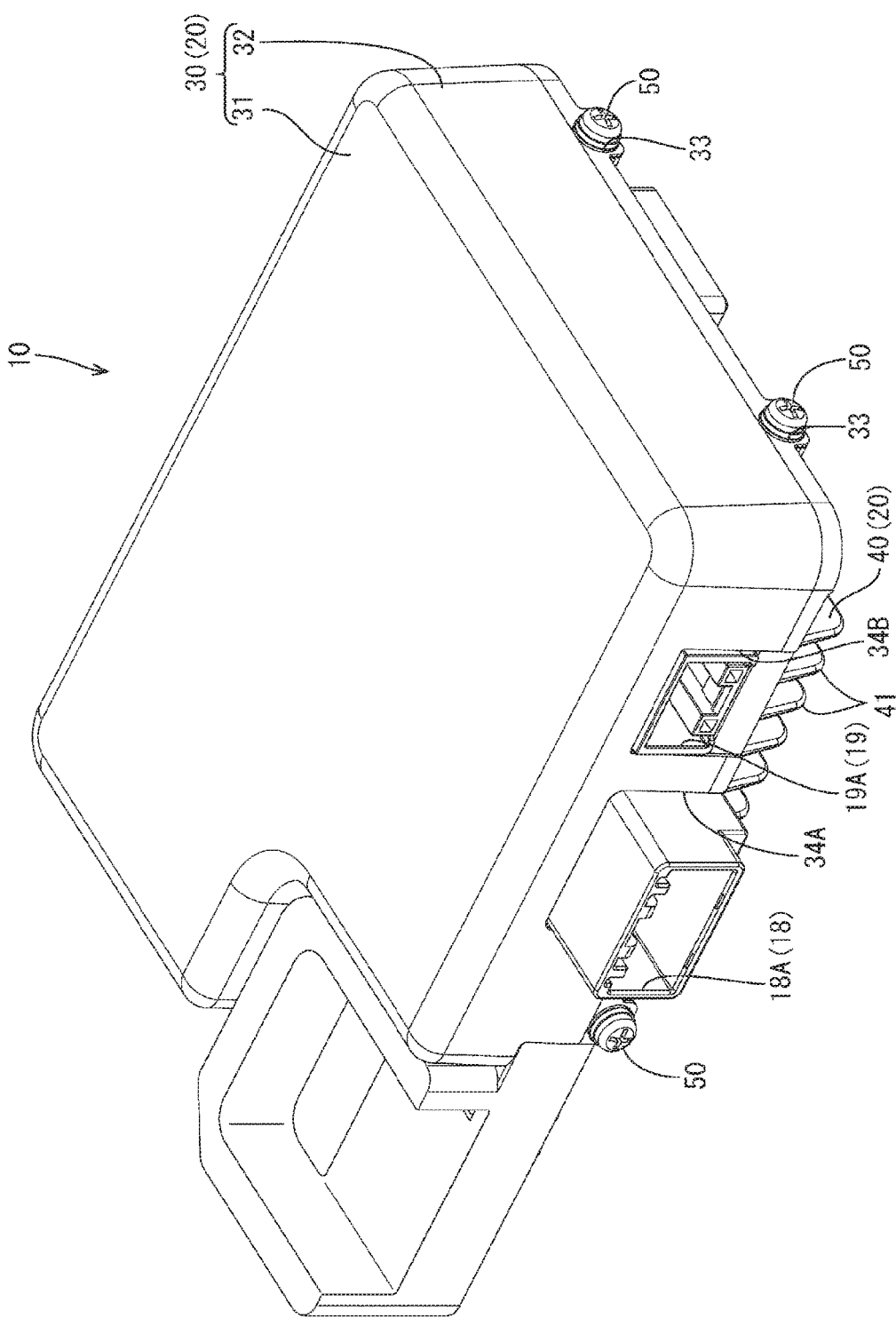
FIG. 1 is a perspective view of an electrical junction box of Embodiment 1.
Figure 2:
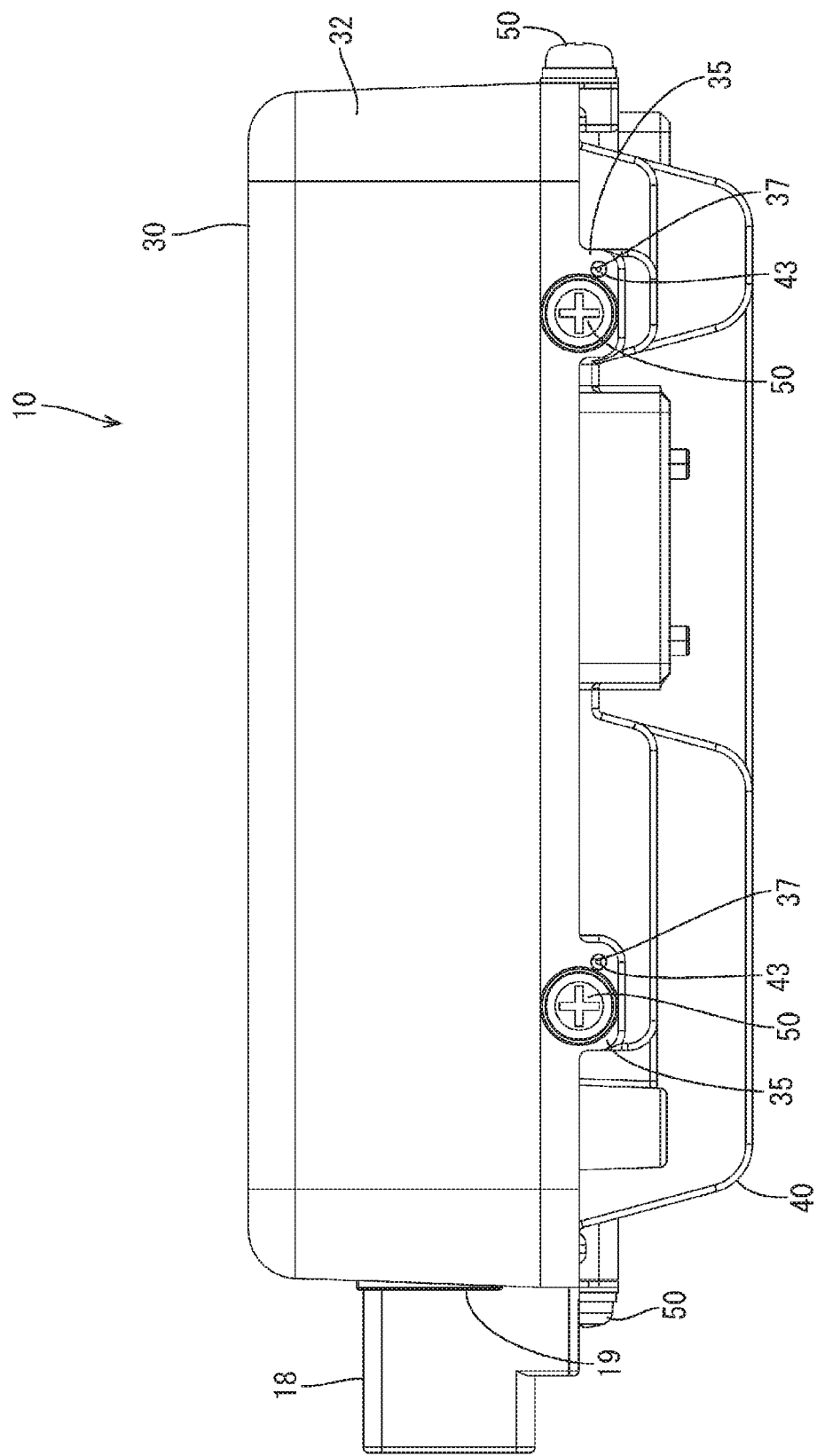
FIG. 2 is a side view of the electrical junction box.
Figure 3:
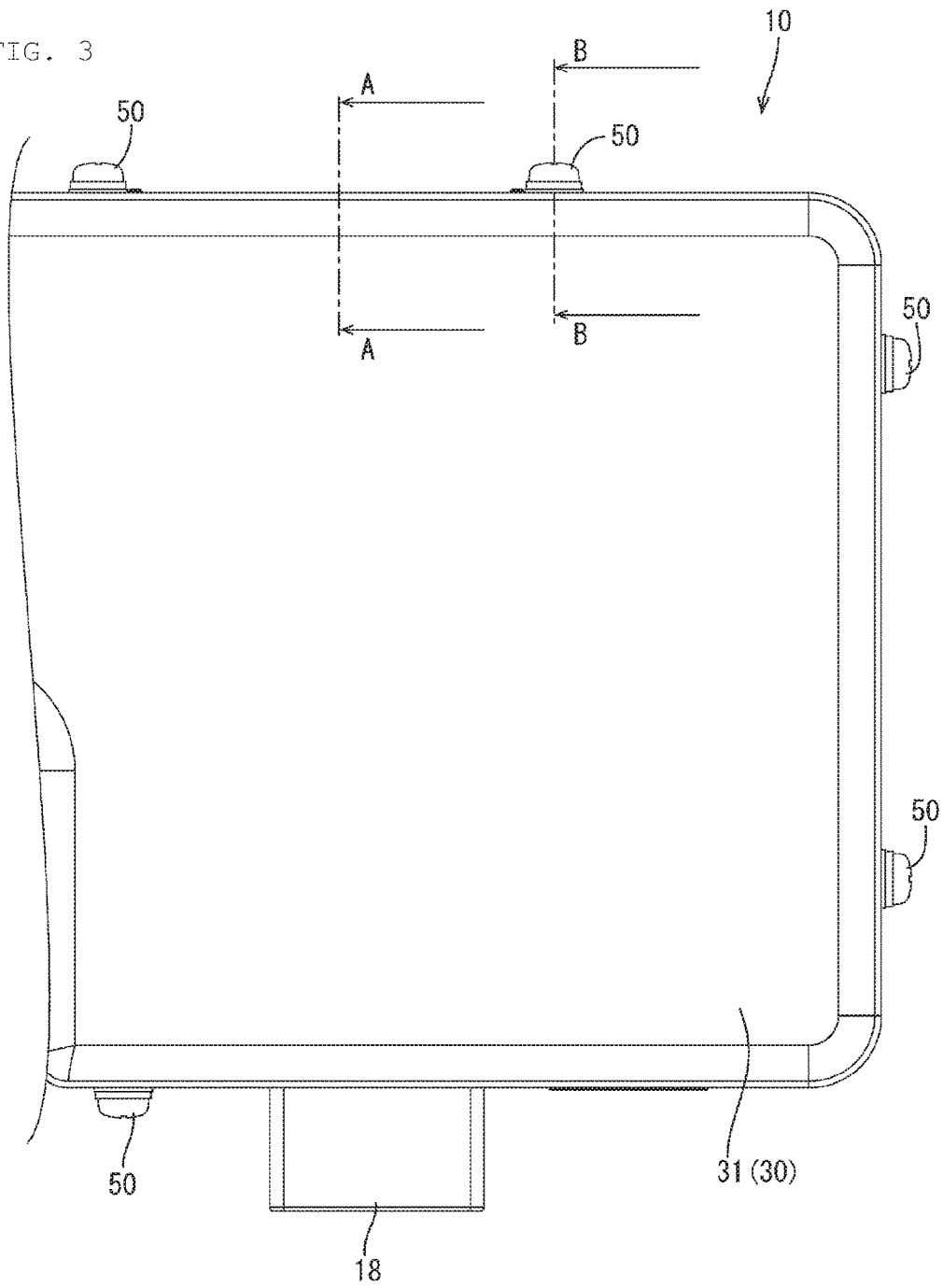
FIG. 3 is a partial plan view of the electrical junction box.

As shown in FIG. 1, the electrical junction box 10 includes a circuit structure 11, a case main body 21 that accommodates the circuit structure 11, and a cover 30. The circuit structure 11 includes a first circuit board 12 that is disposed on an upper surface of a heat dissipation member 40, a second circuit board 17 that is disposed parallel to and above the first circuit board 12 while being spaced apart therefrom by a predetermined distance, and a connector portion 18 that is connectable to an external device (not shown).

The first circuit board 12 has such a shape that it can be fitted in a frame portion 22 of the case main body 21, and is configured by placing a printed wiring board 13 and a busbar 14 one on top of the other. In the printed wiring board 13, a conductive path made of copper foil or the like is formed on an insulating board made of an insulating material using a printed wiring technique. The busbar 14 is formed by punching a metal plate material made of a copper alloy or the like in accordance with the shape of the conductive path, and end portions of a portion thereof form a pair of connector terminals (not shown) that are bent into a crank shape and extend forward.

The first circuit board 12 is fixed to the upper surface of the heat dissipation member 40 through bonding using a heat dissipation adhesive 16. Moreover, an electronic component 15 is mounted on the first circuit board 12.

The second circuit board 17 is fixed to an upper portion of the case main body 21 while being in a position parallel to the first circuit board 12 and being spaced apart therefrom by the predetermined distance. In the second circuit board 17, a conductive path made of copper foil or the like is formed on an insulating board made of an insulating material using a printed wiring technique.

The conductive path of the first circuit board 12 and the conductive path of the second circuit board 17 are connected to each other by a plurality of terminals (not shown).

According to the present embodiment, the case main body 21 made of a synthetic resin, which serves as an accommodating container 20 and accommodates the circuit structure 11, the cover 30 made of a metal, and the heat dissipation member 40 made of a metal, which accommodates the case main body 21 in conjunction with the cover 30, are provided. According to the present embodiment, the case main body 21 rests on the upper surface of the heat dissipation member 40, and the cover 30 is put over the case main body 21. The heat dissipation member 40 will be described first.

The heat dissipation member 40 is made of a metal material having high thermal conductivity, such as an aluminum alloy or a copper alloy. The surface (upper surface) of the heat dissipation member 40 on which the case main body 21 rests constitutes a flat surface, and a large number of heat dissipation fins 41 are disposed lined up on a lower surface side of the heat dissipation member 40. A plurality of screw holes 42 (see FIG. 5) for fixing the cover 30 are formed in an outer perimeter of the heat dissipation member 40. In the outer perimeter of the heat dissipation member 40, beside the individual screw holes 42, positioning protrusions 43 for positioning screw insertion holes 33 of the cover 30 are formed protruding outward (see FIG. 2).

The cover 30 is formed into a box shape whose lower side is open, by punching and bending a plate-shaped metal composed of aluminum or the like. The cover 30 has a covering wall 31 that covers an accommodating portion 29 of the case main body 21 and side walls 32 that are continuous with the covering wall 31 and that are disposed around the case main body 21. According to the present embodiment, an angle α that is defined by the covering wall 31 and each side wall 32 is an obtuse angle, so that the ease of molding is achieved, and it is possible to smoothly perform an attachment operation of putting the cover 30 over the case main body 21 and attaching the cover 30 to the heat dissipation member 40.

Among the side walls 32 of the cover 30, the side wall 32 that is disposed on the front side has openings 34A and 34B that are formed by cutting the side wall 32 and have substantially rectangular shapes that conform to external shapes of a housing 18A for the connector portion 18 and a housing 19A for a controlling connector 19, respectively.

Moreover, in lower edge portions of the side walls 32 of the cover 30, extended portions 35 that are extended toward the lower side are provided in regions corresponding to the respective screw holes 42 of the above-described heat dissipation member 40, and the screw insertion holes 33 through which screws 50 are inserted are formed in the respective extended portions 35. As a result of inserting the screws 50 into the screw insertion holes 33 and screwing the screws 50 into the screw holes 42 of the heat dissipation member 40, the cover 30 is fixed to the heat dissipation member 40 and electrically connected to the ground via the heat dissipation member 40.

Moreover, in the extended portions 35 of the side walls 32 of the cover 30, positioning holes 37 that receive the respective positioning protrusions 43 of the heat dissipation member 40, thereby positioning the screw insertion holes 33 of the cover 30 relative to the screw holes 42 of the heat dissipation member 40, are formed. In each of the extended portions 35, a corresponding one of the positioning holes 37 and a corresponding one of the screw insertion holes 33 are provided side-by-side.

Although not shown in detail, the case main body 21 has the frame portion 22 that is formed into a frame shape along a peripheral portion of the heat dissipation member 40. A space delimited by the frame portion 22 and the upper surface of the heat dissipation member 40, which will be described later, constitutes the accommodating portion 29 that accommodates the circuit structure 11. A front surface of the frame portion 22 is partially cut, and the controlling connector 19 and the connector portion 18 are disposed in the respective cut portions.

Figure 4:
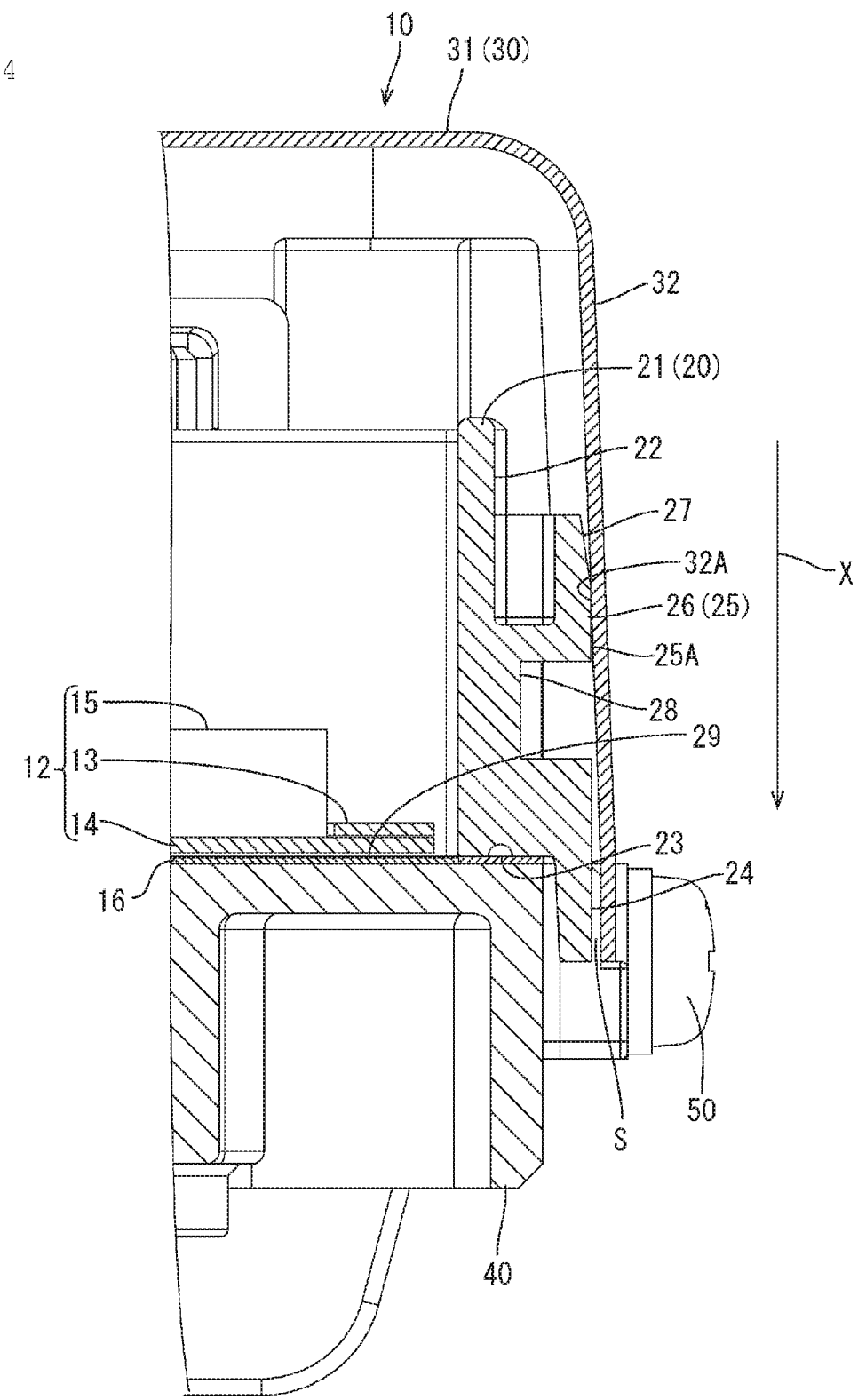
FIG. 4 is a partial cross-sectional view taken along line A-A in FIG. 3.
Figure 5:
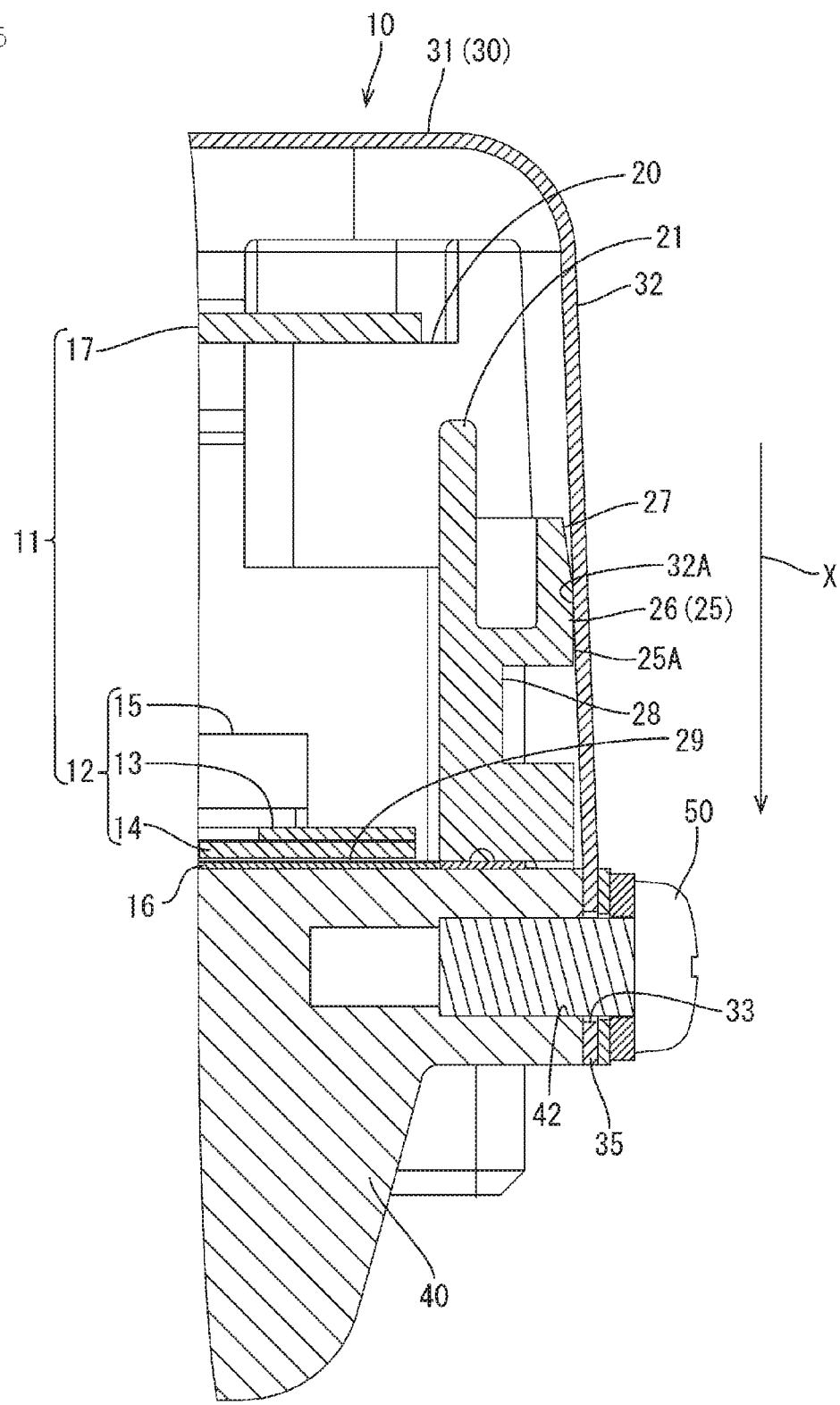
FIG. 5 is a partial cross-sectional view taken along line B-B in FIG. 3.

As shown in FIG. 4, the frame portion 22 of the case main body 21 has a resting portion 23 that rests on the upper surface of the heat dissipation member 40 and an extended piece 24 that is extended downward from the resting portion 23 and that is disposed between a side surface of the heat dissipation member 40 and the cover 30. Portions of the extended piece 24 of the frame portion 22 that correspond to the respective screw holes 42 of the heat dissipation member 40 are cut, so that the screw holes 42 of the heat dissipation member 40 and the corresponding screw insertion holes 33 of the cover 30 are superposed on each other (see FIG. 5).

In the present embodiment, the frame portion 22 of the case main body 21 is provided with an abutment portion 26 that abuts on a portion 32A of each side wall 32 of the cover 30, but not an end portion (end portion on the lower side in FIG. 4) of the side wall 32 that is located on the side facing away from the covering wall 31. More specifically, the abutment portion 26 is the portion that abuts on a portion of the side wall 32 of the cover 30 that is located closer to an end portion (upper side in the drawing) on the covering wall 31 side than to the end portion (lower end portion of the side wall 32 in the drawing) that is located on the side facing away from the covering wall 31. As shown in FIG. 4, the abutment portion 26 is a portion of a protruding portion 25 that is formed protruding in an outward direction from an outer surface of the frame portion 22, and abuts on the side wall 32 of the cover 30.

Figure 6:
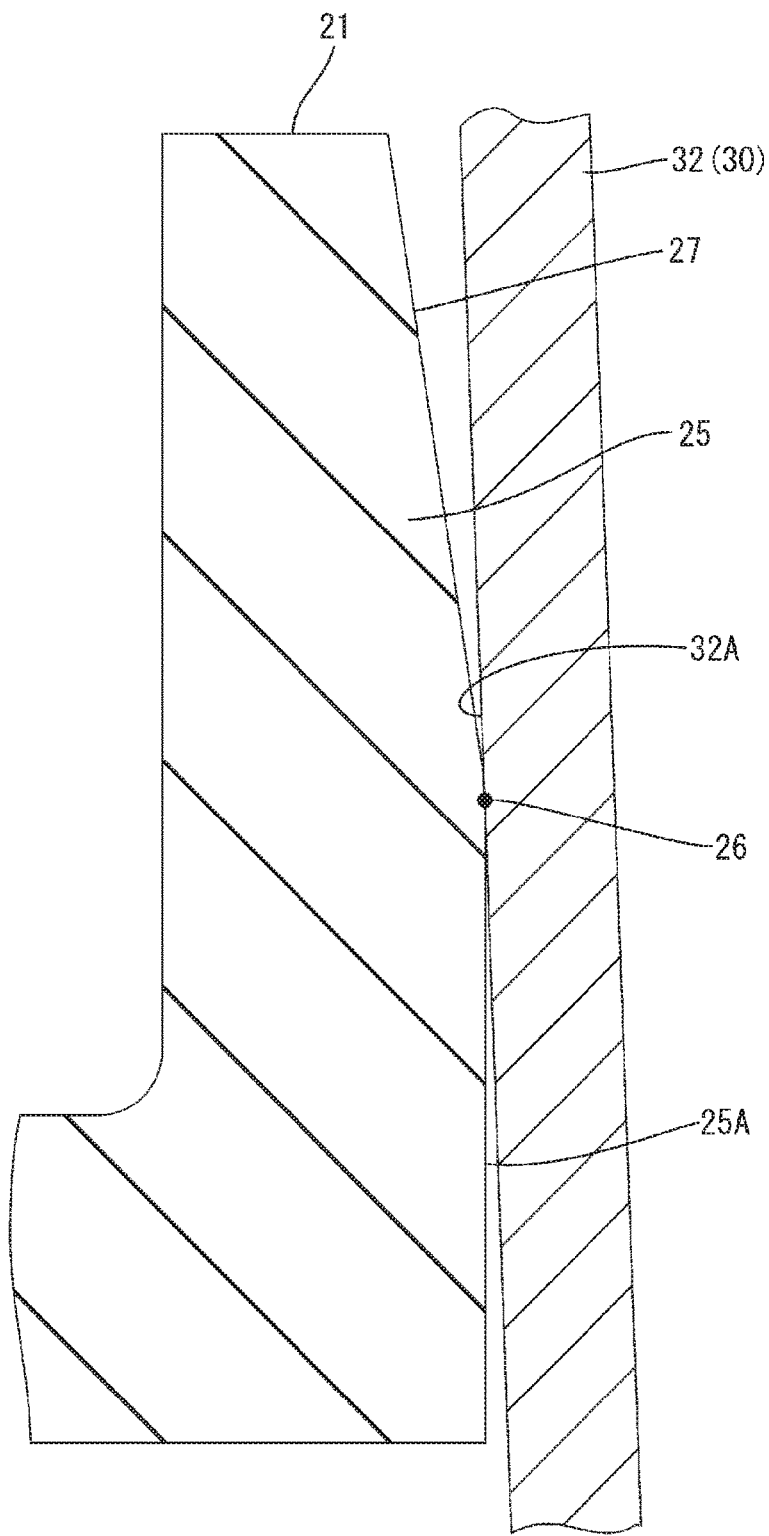
FIG. 6 is an enlarged cross-sectional view of a relevant portion in FIG. 4.

As shown in FIG. 6, the abutment portion 26 has a curved shape in cross section taken in a direction that is parallel to an attachment direction of the cover 30. Moreover, one abutment portion 26 is provided for each one of the side walls 32 in cross section (cross section shown in FIGS. 4 to 6) taken in the direction that is parallel to the attachment direction of the cover 30. As shown in FIG. 6, the abutment portion 26 is in contact with the side wall 32 of the cover 30 at one point. It should be noted that a frontward direction with respect to the attachment direction of the cover 30 is the direction in which arrow X shown in FIGS. 4 and 5 points (i.e., downward direction in the drawings).

An inclined surface (an example of a guide surface) that guides the cover 30 in the attachment direction (downward direction in FIG. 4) is formed in a surface of the case main body 21 that is continuous with the abutment portion 26. More specifically, an inclined surface 27 is formed in a portion of the protruding portion 25 that is located above the abutment portion 26, the inclined surface 27 being formed such that the thickness decreases toward an upper end thereof. The inclined surface 27 functions as the guide surface during attachment of the cover 30 to the case main body 21.

Moreover, in the protruding portion 25 of the case main body 21, a surface 25A that is continuous with the abutment portion 26 and that extends in a direction away from the side wall 32 of the cover 30 is formed frontward (downward) of the abutment portion 26 with respect to the attachment direction of the cover 30.

In the frame portion 22, a recess 28 that is recessed inward is provided below the abutment portion 26 and below (an example of the frontward direction with respect to the attachment direction of the cover) the surface 25A of the protruding portion 25. The recess 28 functions as a drain portion through which water that has entered between the case main body 21 and the cover 30 is drained. Moreover, the recess 28 also has the function of adjusting the position and the area of the abutment portion 26.

The position at which the abutment portion 26 abuts on the cover 30, the abutment area (contact area), and the like can be adjusted as appropriate by providing the recess 28. It should be noted that in the present embodiment, if water enters through a gap S (between the case main body 21 and the cover 30) between the frame portion 22 of the case main body 21 and the cover 30, the water that has entered accumulates in the recess 28 and is drained to the outside of the case main body 21 and the cover 30, and thus, the circuit structure 11 can be protected against the entry of water.

Next, procedures for assembling the electrical junction box 10 will be described.

First, the frame portion 22 (case main body 21) is attached to the heat dissipation member 40 to the upper surface of which the heat dissipation adhesive 16 has been applied so that the frame portion 22 surrounds the perimeter of the heat dissipation member 40, the first circuit board 12 is disposed on the upper surface of the heat dissipation member 40, and curing and bonding is performed through heating. Moreover, the controlling connector 19 and the second circuit board 17 are placed and fixed at predetermined positions in the case main body 21.

Next, the cover 30 is put over the case main body 21 from above the case main body 21. As a result, the side walls 32 of the cover 30 abut on an upper end of the respective protruding portions 25 of the frame portion 22 provided in the case main body 21. When the cover 30 is moved further downward, the side walls 32 of the cover 30 are guided by the inclined surfaces 27 of the abutment portions 26 of the case main body 21, and thus the cover 30 smoothly moves in the attachment direction (downward direction).

When the cover 30 is moved to a position at which the positioning protrusions 43 of the heat dissipation member 40 are received in the respective positioning holes 37 of the cover 30, the screw insertion holes 33 of the cover 30 are disposed at positions coinciding with the respective screw holes 42 of the heat dissipation member 40, and thus, the cover 30 is positioned relative to the heat dissipation member 40.

Finally, the screws 50 are inserted into the respective screw insertion holes 33 of the cover 30 and the corresponding screw holes 42 of the heat dissipation member 40, which are disposed coinciding with the screw insertion holes 33, to perform fastening through screwing. Thus, the cover 30 is attached to the case main body 21, covering the case main body 21, and the side walls 32 of the cover 30 and the abutment portions 26, which are provided in the frame portion 22 of the case main body 21, abut on each other.

Next, the effects of the present embodiment will be described.

In the present embodiment, the case main body 21 made of a synthetic resin is provided with the abutment portions 26 that abut on the respective portions 32A of the side walls 32 of the cover 30 made of a metal, which is attached to the case main body 21, covering the accommodating portion 29, but not on the end portions of the side walls 32 that are located on the side facing away from the covering wall 31. Therefore, even when the electrical junction box is exposed to vibration as in the case where it is installed in a vehicle such as an automobile, vibration is suppressed due to the cover 30 abutting on the abutment portions 26 of the case main body 21, and thus the generation of noise is suppressed.

Moreover, according to the present embodiment, the inclined surfaces 27, which guide the cover 30 in the attachment direction, are formed in the surfaces of the case main body 21 that are continuous with the respective abutment portions 26. Therefore, after the cover 30 and the case main body 21 abut on each other, the cover 30 is guided in the attachment direction by the inclined surfaces 27, which are formed in the respective abutment portions 26, and thus the cover 30 can be smoothly attached to the case main body 21.

Moreover, according to the present embodiment, the surfaces 25A, which are continuous with the respective abutment portions 26 and which extend in the direction away from the respective side walls 32 of the cover 30, are formed frontward (downward) of the abutment portions 26 with respect to the attachment direction of the cover 30. Therefore, the cover 30 and the case main body 21 do not come into contact with each other below the abutment portions 26, and thus the effect of suppressing the generation of noise is ensured.

Moreover, according to the present embodiment, the abutment portions 26 each have a curved shape in cross section taken in the direction that is parallel to the attachment direction of the cover 30. Therefore, damage due to the contact of the side walls 32 of the cover 30 with the abutment portions 26 can be prevented.

Moreover, according to the present embodiment, one abutment portion 26 is provided for each one of the side walls 32 in cross section taken in the direction that is parallel to the attachment direction of the cover 30. Therefore, the cover 30 and the case main body 21 do not abut on each other at a plurality of locations, and thus the effect of suppressing the generation of noise is ensured.

Moreover, according to the present embodiment, the angle that is defined by the covering wall 31 and each side wall 32 is an obtuse angle. Therefore, the ease of molding is achieved.

Moreover, according to the present embodiment, the case main body 21 is provided with the recess 28 through which water that has entered between the case main body 21 and the cover 30 is drained, the recess 28 being formed frontward (downward) of the abutment portions 26 with respect to the attachment direction of the cover 30. Therefore, the circuit structure 11 can be protected against the entry of water. Also, the position and the area of the abutment portions 26 can be adjusted by adjusting the position of the recess 28.

Furthermore, according to the present embodiment, the heat dissipation member 40 made of a metal, which accommodates the case main body 21 in conjunction with the cover 30, is provided. Therefore, the heat dissipation member 40 that dissipates heat generated from the circuit structure 11 also functions as the accommodating container 20, and thus the heat dissipation properties can be increased while reducing the number of components.

In addition, according to the present embodiment, the positioning portions (positioning holes 37, positioning protrusions 43) that position the screw insertion holes 33 of the cover 30 relative to the respective screw holes 42 of the heat dissipation member 40 are provided in the heat dissipation member 40 and the cover 30. Therefore, it is possible to fasten the cover 30 to the heat dissipation member 40 through screwing while positioning the cover 30 relative to the heat dissipation member 40, and thus the workability is excellent.

Other Embodiments

The technique disclosed in this specification is not limited to the embodiment that has been described above with reference to the drawings, and embodiments such as those described below, for example, are also conceivable.

(1) In the foregoing embodiment, a configuration in which the inclined surfaces 27, which guide the cover 30 in the attachment direction, are formed in the surfaces that are continuous with the respective abutment portions 26 has been described. However, a configuration without the inclined surfaces may also be adopted.

(2) In the foregoing embodiment, the protruding portions 25 in which the surfaces 25A that are continuous with the respective abutment portions 26 and that extend in a direction away from the respective side walls 32 of the cover 30 are formed below the abutment portions 26 have been described. However, it is also possible that surfaces that are disposed along the side walls of the cover are formed below the respective protruding portions so as to be continuous therewith.

(3) In the foregoing embodiment, an example in which the abutment portions 26 each have a curved shape in cross section taken in the direction that is parallel to the attachment direction of the cover 30 has been described. However, an embodiment is also conceivable in which the above-described cross-sectional shape of the abutment portions has a corner portion.

(4) In the foregoing embodiment, an example in which one abutment portion 26 is provided for each one of the side walls 32 in cross section taken in the direction that is parallel to the attachment direction of the cover 30 has been described. However, two or more abutment portions 26 may also be provided for each one of the side walls 32.

(5) In the foregoing embodiment, the cover 30 in which the angle defined by the covering wall 31 and each side wall 32 is an obtuse angle has been described. However, the angle that is defined by the covering wall and each side wall may also be 90° or less.

(6) In the foregoing embodiment, a configuration in which the case main body 21 is provided with the recess 28 through which water that has entered between the cover 30 and the case main body 21 is drained and with which the position and the like of the abutment portions 26 are adjusted has been described. However, a configuration without the recess may also be adopted. Moreover, a member that has the function of adjusting the abutment portions 26 and a member that functions as a drain portion may be constituted by separate members. Furthermore, a configuration may also be adopted in which a member having only one of these functions is provided.

(7) In the foregoing embodiment, a configuration in which the heat dissipation member 40 that accommodates the case main body 21 in conjunction with the cover 30 is provided has been described. However, a configuration without the heat dissipation member may also be adopted, or a heat dissipation member that does not have the function of an accommodating container may be provided.

(8) In the foregoing embodiment, an example in which the heat dissipation member 40 is provided with the positioning protrusions 43 while the cover 30 is provided with the positioning holes 37 has been described. However, it is also possible that the heat dissipation member is provided with positioning holes while the cover is provided with positioning protrusions, or a configuration in which the heat dissipation member and the cover are provided with no positioning portions may also be adopted.

The invention claimed is:

1. An electrical junction box comprising:
a circuit structure;
a case main body that is made of a synthetic resin and that has an accommodating portion that accommodates the circuit structure; and
a cover that is made of a metal and that is attached to the case main body, covering the accommodating portion of the case main body;
wherein the cover made of metal has a covering wall that covers the accommodating portion of the case main body and a side wall that is continuous with the covering wall and that is disposed around the case main body;

the case main body is provided with an abutment portion that abuts on a portion of the side wall of the cover made of metal, but not on an end portion of the side wall that is located on the side facing away from the covering wall;

gaps are formed between the case main body and the cover made of metal, the gaps being respectively located on the side facing the covering wall and the side facing away from the covering wall with respect to the abutment portion; and wherein the case main body is provided with a recess through which water that has entered between the case main body and the cover is drained, the recess being provided frontward of the abutment portion with respect to an attachment direction of the cover made of metal.

2. The electrical junction box according to claim 1, wherein a guide surface that guides the cover made of metal in an attachment direction is formed in a surface of the case main body that is continuous with the abutment portion.

3. The electrical junction box according to claim 1, wherein a surface that is continuous with the abutment portion and that extends in a direction away from the side wall of the cover made of metal is formed frontward of the abutment portion with respect to an attachment direction of the cover made of metal.

4. The electrical junction box according to claim 1, wherein the abutment portion has a curved shape in cross section taken in a direction that is parallel to an attachment direction of the cover made of metal.

5. The electrical junction box according to claim 1, wherein only one abutment portion is provided for each one of said side walls in cross section taken in a direction that is parallel to an attachment direction of the cover made of metal.

6. The electrical junction box according to claim 1, wherein an angle that is defined by the covering wall and the side wall is an obtuse angle.

7. The electrical junction box according to claim 1, further comprising a heat dissipation member that is made of a metal and that accommodates the case main body in conjunction with the cover made of metal.

\* \* \* \* \*